US006785389B1

(12) United States Patent
Sella et al.

(10) Patent No.: US 6,785,389 B1
(45) Date of Patent: Aug. 31, 2004

(54) SYSTEM FOR BITSTREAM GENERATION

(75) Inventors: Yaron Sella, Jerusalem (IL); Aviad Kipnis, Jerusalem (IL)

(73) Assignee: NDS Limited, Staines Middlesex (GB)

( * ) Notice: Subject to any disclaimer, the term of this patent is extended or adjusted under 35 U.S.C. 154(b) by 860 days.

(21) Appl. No.: 09/691,777

(22) Filed: Oct. 18, 2000

(30) Foreign Application Priority Data

Nov. 11, 1999 (IL) ................................................. 132898

(51) Int. Cl.[7] .............................................. H04L 9/00
(52) U.S. Cl. ...................... 380/46; 380/265; 708/209; 708/252; 708/253; 377/54; 377/64; 377/67; 377/72; 365/78
(58) Field of Search ................................ 708/209, 252, 708/253; 377/54, 64, 67, 72; 380/265, 46; 365/78

(56) References Cited

U.S. PATENT DOCUMENTS

| 3,609,327 | A | | 9/1971 | Perlman |
| 5,268,949 | A | * | 12/1993 | Watanabe et al. .............. 377/33 |
| 5,365,588 | A | | 11/1994 | Bianco et al. ................. 380/42 |
| 5,383,143 | A | | 1/1995 | Pressly |
| 5,446,683 | A | * | 8/1995 | Mullen et al. ............... 708/256 |
| 5,612,963 | A | | 3/1997 | Koenemann |
| 5,784,427 | A | * | 7/1998 | Bennett et al. ................ 377/72 |
| 6,463,448 | B1 | * | 10/2002 | Mo ............................. 708/252 |

FOREIGN PATENT DOCUMENTS

EP 0 615 361 A1 9/1994

OTHER PUBLICATIONS

*Applied Cryptography, Protocols Algorithms and Source Code in C.*, Bruce Schneier, John Wiley & Sons, Inc., 1996, pp. 381–388.
*Handbook of Applied Cryptography*, by Alfred J. Menezes, Paul C. Van Oorschot and Scott A. Vanstone, CRC Press, LLC, 1997, pp. 202–211.

* cited by examiner

Primary Examiner—Gregory Morse
Assistant Examiner—Paul Callahan
(74) Attorney, Agent, or Firm—Darby & Darby

(57) ABSTRACT

A bitstream generator including a plurality of linear feed shift registers (LFSRs) operative to generate a bit stream and including: at least a first LFSR operative, when assigned as a generator during a first time period including at least one clock cycle, to provide an output bit in each clock cycle within the first time period, and at least a second LFSR operative, when assigned as an assignor during the first time period, to provide in each clock cycle an output bit for determining assignments of at least some of the plurality of LFSRs for a second time period following the first time period, the assignments including assignment as a generator, and assignment as an assignor, and a first combiner operative to combine output bits from all of the at least a first LFSR being assigned as generators thereby to produce during each clock cycle a single output bit which is provided to the bit stream.

Related apparatus and methods are also provided.

23 Claims, 2 Drawing Sheets

SYSTEM FOR BITSTREAM GENERATION

FIELD OF THE INVENTION

The present invention generally relates bitstream generators that use linear feed shift registers.

BACKGROUND OF THE INVENTION

Bitstream generators are typically used to generate bit stream ciphers. A specific family of bitstream generators is a family of bitstream generators that use linear feed shift registers (LFSRs) to generate stream ciphers. This family of bitstream generators is well known in the art and described, for example, in the following publications:

Applied Cryptography, Protocols Algorithms and Source Code in C, second edition, by Bruce Schneier, John Wiley & Sons Inc., 1996, pages 381–388; and Handbook of Applied Cryptography, by Alfred J. Menezes, Paul C. van Oorschot and Scott A. Vanstone, CRC Press LLC, 1997, pages 202–211.

The disclosures of all references mentioned above and throughout the present specification are hereby incorporated herein by reference.

SUMMARY OF THE INVENTION

The present invention seeks to provide an improved bitstream generator that provides better security of a bit stream generated thereby.

In a preferred embodiment of the present invention, a bitstream generator includes a plurality of linear feed shift registers (LFSRs) each of which may be assigned different assignments during different time periods. The output of the bitstream generator is typically used to generate at least one of the following: a bit stream cipher; a hash function; and a pseudo-random binary sequence (PRBS). The bit stream cipher, the hash function and the PRBS may be each used for various application schemes, such as authentication schemes, signature schemes, validation schemes, and verification schemes, and also for various applications, such as integrity check applications, and encryption applications.

The plurality of LFSRs may operate in a "horserace" mode of operation by assigning different assignments to at least some of the plurality of the LFSRs during different "race" time periods. During a first time period, at least a first one of the plurality of LFSRs is assigned as a generator, and at least a second one of the plurality of LFSRs is assigned as an assignor.

Preferably, all the generators produce LFSR output bits that preferably undergo a selection operation and a combination operation in a first combiner. The first combiner is controlled by a control logic unit and is preferably ultimately operative to generate a single output bit every clock cycle. A collection of such single output bits generated during many time periods forms a stream of bits that may be used as described above.

Preferably, all the assignors produce LFSR output bits that preferably undergo a selection operation, a combination operation, and a scrambling operation in a second combiner. The second combiner is ultimately preferably operative to generate a series of decision bits during the first time period. The series of decision bits is preferably used as an entry to a policy table that preferably determines assignments of each of at least some of the plurality of LFSRs as either a generator or an assignor for a second time period following the first time period. The assignments determined by the policy table are effected by the control logic unit through control of the operation of the plurality of the LFSRs and the second combiner.

It is appreciated that an assignment as an assignor may also include an assignment as a combined assignor and lag generator. The lag generator is preferably operative to determine a lag of N shifts for a specific LFSR during a specific time period, where N is an integer number. Thus, during the specific time period, the specific LFSR performs less bit shifts than an LFSR for which a lag is not determined.

In a preferred embodiment of the present invention at least a third one of the plurality of the LFSRs may be assigned, during the first time period, an assignment as a time-period assignor. All the time-period assignors produce LFSR output bits that undergo a selection operation, a combination operation, and a scrambling operation in a third combiner to ultimately generate a series of time decision bits during the first time period. The series of time decision bits is preferably used as an input to another policy table that determines the second time period, that is, a start time of the second time period, and a duration of the second time period. The start time of the second time period and the duration of the second time period are preferably effected by the control logic unit through control of the operation of the plurality of the LFSRs and the third combiner.

There is thus provided in accordance with a preferred embodiment of the present invention a bitstream generator including a plurality of linear feed shift registers (LFSRs) operative to generate a bit stream and including at least a first LFSR operative, when assigned as a generator during a first time period including at least one clock cycle, to provide an output bit in each clock cycle within the first time period, and at least a second LFSR operative, when assigned as an assignor during the first time period, to provide in each clock cycle an output bit for determining assignments of at least some of the plurality of LFSRs for a second time period following the first time period, the assignments including: assignment as a generator and assignment as an assignor, and a first combiner operative to combine output bits from all of the at least a first LFSR being assigned as generators thereby to produce during each clock cycle a single output bit which is provided to the bit stream.

Preferably, the first combiner includes at least one combinatorial selection logic device which is operative to combine the output bits from all of the at least a first LFSR being assigned as generators to produce a set of intermediate bits, a generator lookup table (LUT) operatively associated with the at least one combinatorial selection logic device and operative to combine the set of intermediate bits to form a single output bit, and an output buffer, operatively associated with the generator LUT and operative to output the single output bit. The combinatorial selection logic device may preferably include a multiplexer (MUX).

Additionally, the bitstream generator may include a second combiner operative to combine output bits from all of the at least a second LFSR that are assigned as assignors to produce a series of decision bits which are applied as an entry to a policy table to determine assignments of each of at least some of the plurality of LFSRs for the second time period. Preferably, the second combiner includes at least one combinatorial selection logic device which is operative to combine the output bits from all of the at least a second LFSR that are assigned as assignors to produce a set of bits every clock cycle, an assignor LUT operatively associated with the at least one combinatorial selection logic device and operative to combine the set of bits to form a single intermediate bit every clock cycle, and a scrambling buffer, operatively associated with the assignor LUT and operative to perform scrambling operations on all intermediate bits generated during the first time period and to output a series of decision bits to the policy table.

Preferably, the assignment as an assignor also includes an assignment as a combined assignor and lag generator. The lag generator is preferably operative to determine, during the first time period, a lag having a length of an integer number N of shifts for an LFSR for the second time period.

Additionally, the bitstream generator also includes at least a third LFSR operative, when assigned as a time-period assignor during the first time period, to provide an output bit for determining a start time and a, length of the second time period.

Further additionally, the bitstream generator also includes a third combiner operative to combine output bits from all of the at least a third LFSR that are assigned as time-period assignors to produce a series of time decision bits, and a policy table operatively associated with the third combiner and operative to accept the series of time decision bits as an entry for determining the start time and the length of the second time period. The bitstream generator may also include a control logic unit operative to control the operation of at least one of the following: the first combiner, the second combiner, the third combiner, and the plurality of LFSRs.

Preferably, the bit stream includes a pseudo random binary sequence. Alternatively, the single output bit outputted by the first combiner includes a result of a hash function.

The plurality of LFSRs may preferably include LFSRs having different lengths. The different lengths are preferably limited to a selected range of lengths.

Preferably, the first time period and the second time period are each only one clock cycle. Alternatively, the first time period and the second time period may be each longer than one clock cycle.

The second time period may follow the first time period after a time delay. The time delay may include at least one clock cycle. Alternatively, the time delay may include a time period having a length of one of the following: the first time period; and the second time period.

There is also provided in accordance with a preferred embodiment of the present invention a method for generating a bit stream, the method including providing a plurality of linear feed shift registers (LFSRs), assigning at least a first LFSR of the plurality of LFSRs during a first time period as a generator which is operative to provide an output bit in each clock cycle within the first time period, assigning at least a second LFSR of the plurality of LFSRs during the first time period as an assignor which is operative, in each clock cycle, to provide an output bit for determining assignments of at least some of the plurality of LFSRs for a second time period following the first time period, the assignments including: assignment as a generator, and assignment as an assignor, and combining output bits from all of the at least a first LFSR of the plurality of LFSRs being assigned as generators to produce during each clock cycle a single output bit which is provided to the bit stream.

Preferably, the combining step includes the steps of combining the output bits from all of the at least a first LFSR of the plurality of LFSRs being assigned as generators to produce a set of intermediate bits every clock cycle, using a generator lookup table (LUT) to combine the set of intermediate bits to form a single output bit, and outputting the single output bit.

Additionally, the method includes the step of combining output bits from all of the at least a second LFSR of the plurality of LFSRs that are assigned as assignors to produce a series of decision bits which are applied as an entry to a is policy table to determine assignments of each of at least some of the plurality of LFSRs for the second time period.

The combining step may preferably include the steps of combining the output bits from all of the at least a second LFSR of the plurality of LFSRs that are assigned as assignors to produce a set of bits every clock cycle, using an assignor LUT to combine the set of bits to form a single intermediate bit every clock cycle, scrambling all single intermediate bits generated during the first time period to generate a series of decision bits, and outputting the series of decision bits to the policy table.

Preferably, the assignment as an assignor also includes an assignment as a combined assignor and lag generator. The lag generator is preferably operative to determine, during the first time period, a lag having a length of an integer number N of shifts for an LFSR for the second time period.

Additionally, the method includes the step of assigning at least a third LFSR of the plurality of LFSRs during the first time period as a time-period assignor which is operative to provide an output bit for determining a start time and a length of the second time period. Further additionally, the method also includes the step of combining output bits from all of the at least a third LFSR of the plurality of LFSRs that are assigned as time-period assignors to produce a series of time decision bits which are applied as an entry to a policy table to determine the start time and the length of the second time period.

BRIEF DESCRIPTION OF THE DRAWINGS

The present invention will be understood and appreciated more fully from the following detailed description, taken in conjunction with the drawings in which.

DETAILED DESCRIPTION OF A PREFERRED EMBODIMENT

Figure 1:
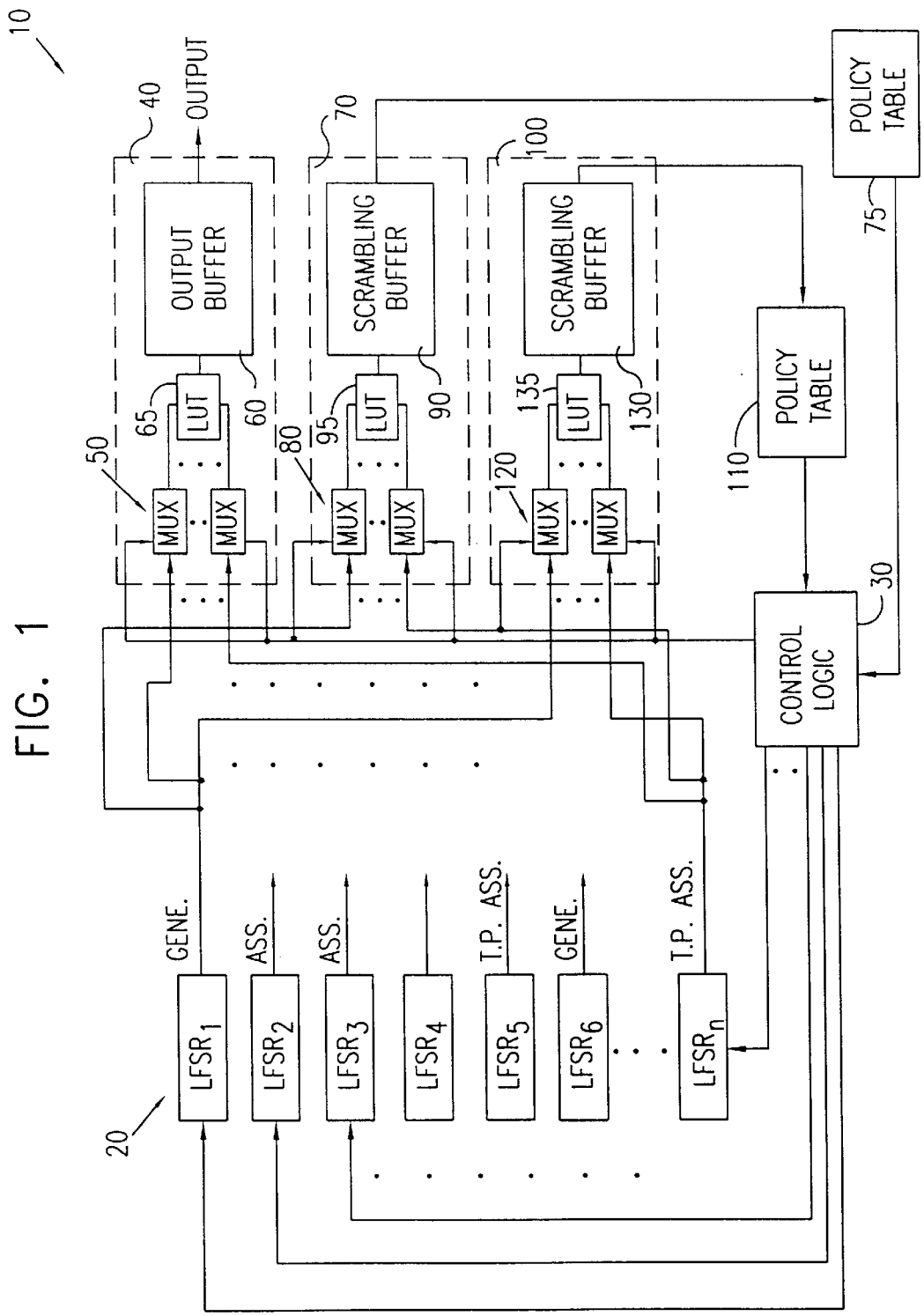
FIG. 1 is a simplified block diagram illustration of a bitstream generator constructed and operative in accordance with a preferred embodiment of the present invention.

Reference is now made to FIG. 1 which is a simplified block diagram illustration of a preferred implementation of a bitstream generator 10, the bitstream generator 10 being constructed and operative in accordance with a preferred embodiment of the present invention. The output of the bitstream generator 10 is preferably used to generate at least one of the following: a bit stream cipher; a hash function; and a pseudo-random binary sequence (PRBS).

Preferably, the bitstream generator 10 includes a plurality of linear feed shift registers (LFSRs) 20. As is well known in the art, an LFSR is a register that includes a plurality of cells, such as, for example, between 64 and 1024 cells. Each cell is preferably operative to store a single basic value, such as a bit, and to transfer the bit to an adjacent cell in response to a clocking signal. The bit is thus shifted from one cell to another until it is outputted or fed back through a feedback mechanism in which bits are fed backwards over one or a plurality of cells in accordance with selected logical criteria. A shift of a bit from one cell to another is referred to herein after as a "step" of the LFSR.

The plurality of LFSRs 20 is preferably controlled by a control logic unit 30 which is operative to provide clocking control for shifting the LFSRs 20 in order to generate LFSR output bits. The control logic unit 30 is also preferably operative to determine, within a current time period, which of the plurality of the LFSRs 20 will contribute LFSR output bits during the current time period. Further preferably, the control logic unit 30 is also operative to determine, within the current time period, which of the plurality of LFSRs 20 will lag in a following time period. The concept of lag of an LFSR 20 refers throughout the present specification and claims to operation of an LFSR that performs fewer bit shifts than an LFSR for which a lag is not determined. Typically, a lag of an LFSR is determined by an integer number of shifts.

Preferably, each of the plurality of LFSRs 20 may be assigned different assignments during different time periods. For example during a first time period at least a first one of the plurality of LFSRs 20 may be assigned as a generator, and at least a second one of the plurality of LFSRs 20 may be assigned as an assignor, wherein an assignment as the assignor may include an assignment as a combined assignor and lag generator. The term "lag generator" refers to a generator of the lag as defined above. It is appreciated that the first time period may have a length of one clock cycle or a length greater than the length of one clock cycle.

All the generators preferably produce LFSR output bits that undergo a selection operation and a combination operation in a first combiner 40. The first combiner 40 is preferably controlled by the control logic unit 30 and is operative to ultimately generate a single output bit every clock cycle. A collection of such single output bits generated during the first time period and a multiplicity of time periods following the first time period forms a bit stream that may be used as described above.

Preferably, the first combiner 40 includes at least one, and preferably a plurality of, combinatorial selection logic devices, such as multiplexers (MUXes) 50, and an output buffer 60. Each MUX 50 is preferably controlled by a gating signal provided by the control logic unit 30 and is operative to output an intermediate bit. The set of intermediate bits outputted by the MUXes 50 is preferably inputted to a generator's lookup table (LUT) 65 which may be also comprised in the first combiner 40.

The generator's LUT 65 combines the set of intermediate bits into the single output bit which is outputted via the output buffer 60. It is appreciated that the single output bit is a contribution, provided by the combiner 40, to the bit stream at the end of each clock cycle. As mentioned above, the collection of such single bits generated during a multiplicity of time periods may form a bit stream that may be used as described above. It is appreciated that the bit stream may be also used for various application schemes, such as authentication schemes, signature schemes, validation schemes, and verification schemes, and also for various applications, such as integrity check applications, and encryption applications.

It is appreciated that the number of MUXes 50 is typically identical to the number of entries to the generator's LUT 65. The number of input ports of each MUX 50 may be equal to or less than the total number of the plurality of LFSRs 20.

Preferably, all the assignors produce LFSR output bits that undergo a selection operation, a combination operation, and a scrambling operation in a second combiner 70. The second combiner 70 is ultimately preferably operative to generate a series of decision bits during the first time period. The series of decision bits is preferably used as an input to a policy table 75 that determines assignments of each of at least some of the plurality of LFSRs 20 as either a generator or an assignor for a second time period following the first time period. The assignments determined by the policy table 75 are preferably effected by the control logic unit 30 through control of the operation of the plurality of the LFSRs 20 and the second combiner 70.

Preferably, the second combiner 70 may include at least one, and preferably a plurality of, combinatorial selection logic devices, such as conventional MUXes 80, and a conventional scrambler, such as a scrambling buffer 90. Each MUX 80 is preferably controlled by a gating signal provided by the control logic unit 30 and is operative to output a bit. The set of bits outputted by the MUXes 80 is inputted to an assignor's LUT 95 which may be also comprised in the second combiner 70.

The assignor's LUT 95 preferably combines the set of bits into a single intermediate bit which is provided to the scrambling buffer 90 at the end of each clock cycle. The scrambling buffer 90 performs scrambling operations, such as linear scrambling operations, as is well known in the art, on all intermediate bits generated during the first time period and outputs the series of decision bits which are provided to the policy table 75. The policy table 75 uses the series of decision bits as inputs, and outputs control bits to the control logic unit 30. The control logic unit 30 preferably uses the control bits to control clocking of the plurality of the LFSRs 20 and the MUXes 80 thereby to determine assignments of at least some of the plurality of LFSRs 20 for the second time period.

The second time period typically follows the first time period. It is appreciated that the second time period may follow the first time period after a delay period. Preferably, the second time period may have a length of a clock cycle or a length greater than the length of a clock cycle.

It is appreciated that the number of MUXes 80 is preferably identical to the number of entries to the LUT 95. The number of input ports of each MUX 80 may be equal to or less than the total number of the plurality of LFSRs 20.

In a preferred embodiment of the present invention at least a third one of the plurality of the LFSRs 20 may be assigned, during the first time period, an assignment as a time-period assignor. All the time-period assignors produce LFSR bits that undergo a selection operation, a combination operation, and a scrambling operation in a third combiner 100 to ultimately generate a series of time decision bits during the first time period. The series of time decision bits is preferably used as an input to a policy table 110 that determines the second time period, i.e., a start time of the second time period, and a duration of the second time period. The start time of the second time period and the duration of the second time period are effected by the control logic unit 30 through control of the operation of the plurality of the LFSRs and the third combiner 100.

Preferably, the third combiner 100 may include at least one, and preferably a plurality of, combinatorial selection logic devices, such as conventional MUXes 120, and a conventional scrambler, such as a scrambling buffer 130 that may comprise a linear scrambling buffer. Each MUX 120 is preferably controlled by a gating signal provided by the control logic unit 30 and is operative to output a bit. The set of bits outputted by the MUXes 120 is inputted to a time-period assignor's LUT 135 which may be also comprised in the third combiner 10.

The time-period assignor's LUT 135 combines the set of bits into a single intermediate bit which is provided to the scrambling buffer 130 at the end of each clock cycle. The scrambling buffer 130 performs scrambling operations, as is well known in the art, on all intermediate bits generated during the first time period and preferably outputs the series of time decision bits which are provided to the policy table 110. The policy table 110 preferably uses the time decision bits as inputs and outputs control bits to the control logic unit 30. The control logic unit 30 preferably uses the control bits to control clocking of the plurality of the LFSRs 20 and the MUXes 120 thereby to determine a start time and a length of the second time period.

The number of MUXes 120 is preferably identical to the number of entries to the LUT 135. The number of input ports of each MUX 120 is preferably equal to the total number of the plurality of LFSRs 20.

It is appreciated that each of the MUXes 50, 80 and 120 may comprise a conventional multiplexer of the type that selects and outputs one bit out of a set of K input bits, where K is an integer number. Some of the K input bits may be selection bits that determine, for given values of the selection bits, which one of the input bits will be selected for output in accordance with a mapping table that is comprised in the multiplexer. For example, a multiplexer M1 that has two input bits I1 and I2 and one selection bit S1 outputs I1 if S1=0, and I2 if S1=1. In an alternative example, a multiplexer M2 that has three input bits I1, I2 and I3 and two selection bits S1 and S2 has the following output options: if S1=0 and S2=0 the multiplexer outputs I1; if S1=1 and S2=1 the multiplexer outputs I2; and if S1=0 and S2=1 or S1=1 and S2=0 the multiplexer outputs I3.

It is further appreciated that the policy table 75 and the policy table 110 may alternatively be combined into a single policy table (not shown) which determines the policy effected by the control logic unit 30.

Preferably, the LUTs 65, 95 and 135 may be accessed electronically as is well known in the art. Each of the LUTs 65, 95 and 135 may preferably be balanced so as to include tables that are balanced among all possible selections of sub-tables that may be selected. In the case of LUTs 95 and 135, selection of sub-tables is typically performed by the policy table 75.

It is appreciated that the assignments assigned to the plurality of LFSRs 20 as shown in FIG. 1 are provided as an example only and different assignments may be assigned within different time periods.

The operation of the apparatus of FIG. 1 is now briefly described. Preferably, the plurality of LFSRs 20 work together in a "horserace" mode determined by many "race" time periods. Typically, each race time period has a length of at least one clock cycle, and preferably a plurality of clock cycles. The term "a first time period" mentioned above refers in this case to an arbitrary race time period. The operation of some of the LFSRs 20 during the first time period affects the operation of other LFSRs 20 in another race time period which, in this case, is the second time period mentioned above. Each of the first time period and the second time period may be at least one clock cycle of the LFSRs 20, and preferably a time period which is longer than one clock cycle. It is appreciated that the first and second time periods may be either adjacent to each other in time or may be separated by a time delay.

Preferably, at least a first one of the plurality of LFSRs 20 is assigned, during the first time period, an assignment as a generator and may be operative to provide an output bit within the first time period. Preferably, the first combiner 40 combines output bits from all of the plurality of LFSRs 20 having the assignment as a generator and outputs a single output bit every clock cycle. It is appreciated that the single output bit is a contribution, provided by the combiner 40, to a bit stream at the end of each clock cycle. The collection of the single output bits generated during the first time period and many race time periods following the first time period forms the output bit stream.

Additionally, at least a second one of the plurality of LFSRs 20 may be assigned, during the first time period, an assignment as an assignor and may be operative to provide an output bit. The second combiner 70 preferably combines the output bits from all of the plurality of LFSRs 20 having the assignment as an assignor and ultimately outputs a series of decision bits. The series of decision bits is then preferably applied as an entry to the policy table 75 to determine assignments of each of at least some of the plurality of LFSRs 20 as either a generator or an assignor for the second time period. The policy table 75 uses the series of decision bits as inputs, and outputs control bits to the control logic unit 30. The control logic unit 30 effects the assignments through control of the clocking of the plurality of the LFSRs and the second combiner 70.

As mentioned above, the assignment as an assignor may also preferably include an assignment as a combined assignor and lag generator. It is appreciated that when an assignor is assigned as a combined assignor and lag generator, the assignor not only participates in the process which determines the assignments of at least some of the LFSRs 20 for the second time period as mentioned above, but also participates in a process which determines a lag of N shifts for specific LFSRs 20 for the second time period, where N is an integer number. An LFSR 20 for which a lag of N shifts is determined performs less bit shifts than an LFSR for which a lag is not determined.

In a preferred embodiment of the present invention a length of the second time period may be determined dynamically. In such a case, at least a third one of the plurality of LFSRs 20 may be assigned, during the first time period, an assignment as a time-period assignor which is operative to provide an output bit. The third combiner 100 preferably combines the output bits from all of the plurality of LFSRs 20 having the assignment as a time-period assignor and ultimately outputs a series of time decision bits during the first time period. The series of time decision bits is then preferably applied as an entry to the policy table 110 to determine the second time period length and start time. It is appreciated that the buffer 70 is operative to select those of the plurality of LFSRs 20 that have the assignment as time period assignors, whereas the buffer 130 is operative to select the second time period length and start time.

As mentioned above, the assignments of the plurality of the LFSRs 20, the lag determinations, and the second time period length and start time determination are effected by the control logic unit 30. Thus, during the second time period whose length is determined according to the series of time decision bits, the plurality of LFSRs 20 are preferably operative in accordance with the assignments determined during the first time period.

It is thus appreciated that during any race time period, some or all of the following groups of LFSRs 20 may be found:
(1) A first group including LFSRs that contribute output bits;
(2) A second group including LFSRs that do not contribute any output at all;
(3) A third group including LFSRs that assign roles; and
(4) A fourth group including LFSRs that determine a length of a following race period.

Additionally, some of the plurality of the LFSRs 20 in each of the above groups (2)–(4) may advance a different number of steps during each race time period, wherein the different number of steps is determined by the policy table 75 and effected by the control logic unit 30. Thus, in each race time period, there may be LFSRs that lag a number of steps N with respect to others.

The result of the above-mentioned operation of the apparatus of FIG. 1 over many race time periods thus resembles a horserace. The horserace mode of operation is characterized by a priori determinations of a plurality of parameters for one or more time periods that follow a current time period.

It is appreciated that the plurality of LFSRs 20 may include LFSRs having different lengths. Alternatively or additionally, the plurality of LFSRs 20 may include LFSRs having different feedback polynomials for controlling clocking of the LFSRs, as is well known in the art.

The length of a maximum cycle LFSR 20, that is the number of cells of the maximum cycle LFSR 20, is important since it determines an LFSR cycle length. Furthermore, in applications involving scrambling/descrambling or encryption/decryption, the sum of the lengths of all the plurality of LFSRs 20 forms a maximal effective key size. It is further appreciated that the shortest of the plurality of LFSRs 20 should still be of considerable length, for example 64 bits, in order to complicate an attack of an adversary.

Preferably, the different lengths of the plurality of LFSRs 20 are limited to a selected range of lengths. It is preferable to avoid a combination of very long LFSRs, such as of the order of hundreds of cells, with very short LFSRs, such as of the order of a few cells, because an adversary may learn an operation scheme from the operation of the very short LFSRs.

As mentioned above, the second time period may follow the first time period after a time delay. The time delay may include at least one clock cycle. Alternatively, the time delay may include a time period having a length of one of the first time period and the second time period.

Upon assigning the assignments of the LFSRs 20 certain rules are preferably applied. The rules may be as follows:
(1) There must be at least one assignor and one generator in every race time period.
(2) More than one LFSR may have a specific role in a race time period, that is there may be a plurality of assignors and generators in each race time period.
(3) An LFSR that is assigned an assignment as a generator during a race time period cannot have any other assignments during that race time period, but an assignor may assign assignments and may also lag.
(4) An LFSR that is assigned an assignment as a generator during a race time period cannot lag.

The policy table 75 is preferably a table containing $Z_1$ entries received from the scrambling buffer 90, where typically $Z_1$, is a power of 2. Each of the $Z_1$ entries preferably assigns assignments to all of the plurality of LFSRs 20. During a current race time period, current assignors produce exactly $\log_2(Z_1)$ bits which are used to select an entry from the policy table 75. The selected entry determines the assignments in the next race time period. Similarly, the policy table 110 is a table containing $Z_2$ entries received from the scrambling buffer 130, where typically $Z_2$ is a power of 2. Each of the $Z_2$ entries preferably assigns time-period assignments to all of the plurality of LFSRs 20. During a current race time period, current time-period assignors produce exactly $\log_2(Z_2)$ bits which are used to select an entry from the policy table 110. The selected entry determines the time-period assignments in the next race time period.

The following are simplified examples showing the use of the apparatus of FIG. 1 in various schemes. In the following examples G is a generator, A is an assignor and L(N) is a lag of N steps.
(1) Scheme A: In this scheme there are 2 LFSRs 20, which change assignments every 3 clock cycles. The policy table 75 in scheme A contains 4 entries and is as follows:

| ENTRY | $LFSR_1$ | $LFSR_2$ |
|---|---|---|
| 1 | G | A + L (1) |
| 2 | G | A |
| 3 | A + L (1) | G |
| 4 | A | G |

(2) Scheme B: In this scheme there are 3 LFSRs 20, which change assignments every 3 clock cycles. The policy table 75 in scheme B contains 4 entries and is as follows:

| ENTRY | $LFSR_1$ | $LFSR_2$ | $LFSR_3$ |
|---|---|---|---|
| 1 | G | A + L (1) | L (1) |
| 2 | L (1) | G | A + L (1) |
| 3 | G | A + L (1) | G |
| 4 | A + L (1) | G | G |

It may be noted that while $LFSR_1$ and $LFSR_2$ may generate alone, $LFSR_3$ always generates with a partner.
(3) Scheme C: In this scheme there are 4 LFSRs 20, which change assignments every 4 clock cycles. The policy table 75 in scheme C contains 16 entries and is as follows:

| ENTRY | $LFSR_1$ | $LFSR_2$ | $LFSR_3$ | $LFSR_4$ |
|---|---|---|---|---|
| 1 | G | G | L (1) | A |
| 2 | G | A | G | L (2) |
| 3 | G | L (3) | A | G |
| 4 | A | G | G | L (3) |
| 5 | L (2) | G | A | G |
| 6 | L (1) | A | G | G |
| 7 | G | G | A | L (1) |
| 8 | G | L (2) | G | A |
| 9 | G | A | L (3) | G |
| 10 | L (3) | G | G | A |
| 11 | A | G | L (2) | G |
| 12 | A | L (1) | G | G |
| 13 | G | A | A | L (1) |
| 14 | A | G | L (1) | A |
| 15 | L (1) | A | G | A |
| 16 | A | L (1) | A | G |

The apparatus of FIG. 1 may be also used to produce a hash function. For example, in a selected series of clock cycles the plurality of LFSRs 20 may be advanced in accordance with a series of input bits each associated with an LFSR. The control logic unit 30 may employ outputs from the policy table 75 to determine the operation of the combiners 40, 70 and 100 and thereby to determine the output bits outputted from the output buffer 60 at the end of the series of clock cycles. In such a case, the output bits from the output buffer 60 may be used as a result of the hash function.

Figure 2:
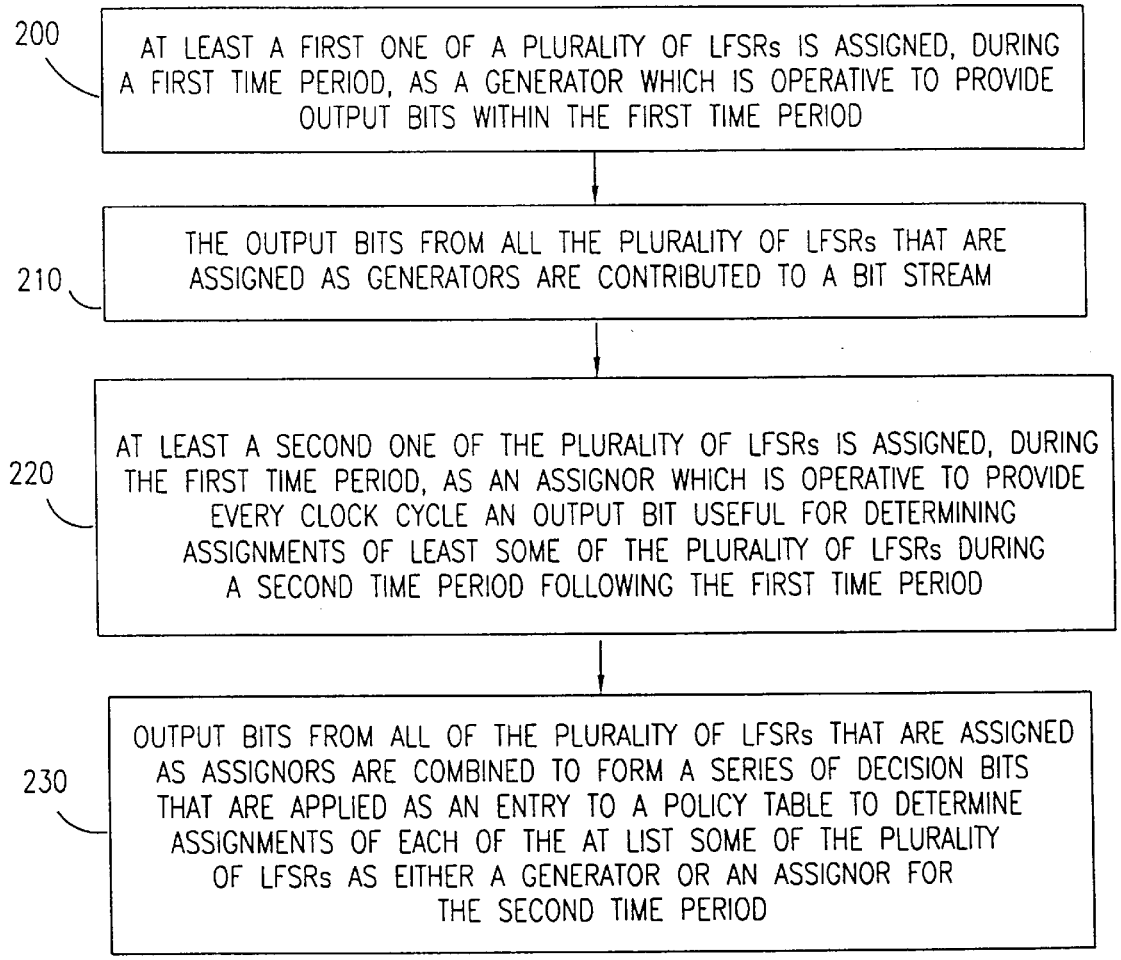
FIG. 2 is a simplified flow chart illustration of a preferred method of operation of the apparatus of FIG. 1.

Reference is now made to FIG. 2 which is a simplified flow chart illustration of a preferred method of operation of the apparatus of FIG. 1.

Preferably, at least a first one of a plurality of LFSRs is assigned, during a first time period, as a generator which is operative to provide output bits within the first time period (step 200). The output bits from all of the plurality of LFSRs that are assigned as generators are contributed to a bit stream (step 210).

Additionally, at least a second one of the plurality of LFSRs is assigned, during the first time period, as an assignor which is operative to provide every clock cycle an output bit useful for determining assignments of at least some of the plurality of LFSRs during a second time period following the first time period (step 220). Output bits from all of the plurality of LFSRs that are assigned as assignors are preferably combined to form a series of decision bits that are applied as an entry to a policy table to determine assignments of each of the at least some of the plurality of LFSRs as either a generator or an assignor for the second time period (step 230).

It is appreciated that various features of the invention that are, for clarity, described in the contexts of separate embodiments may also be provided in combination in a single embodiment. Conversely, various features of the invention which are, for brevity, described in the context of a single embodiment may also be provided separately or in any suitable sub-combination.

It will be appreciated by persons skilled in the art that the present invention is not limited by what has been particularly shown and described herein above. Rather the scope of the invention is defined only by the claims that follow.

What is claimed is:

1. A bitstream generator comprising:
    a plurality of linear feed shift registers (LFSRs) operative to generate a bit stream and comprising:
        at least a first LFSR operative, when assigned as a generator during a first time period comprising at least one clock cycle, to provide an output bit in each clock cycle within said first time period; and
        at least a second LFSR operative, when assigned as an assignor during said first time period, to provide in each clock cycle an output bit for determining assignments of at least some of the plurality of LFSRs for a second time period following said first time period, said assignments including: assignment as a generator; and assignment as an assignor; and
    a first combiner operative to combine output bits from all of the at least a first LFSR being assigned as generators thereby to produce during each clock cycle a single output bit which is provided to the bit stream.

2. A bitstream generator according to claim 1 and wherein said first combiner comprises:
    at least one combinatorial selection logic device which is operative to combine said output bits from all of the at least a first LFSR being assigned as generators to produce a set of intermediate bits;
    a generator lookup table (LUT) operatively associated with said at least one combinatorial selection logic device and operative to combine said set of intermediate bits to form a single output bit; and
    an output buffer, operatively associated with said generator LUT and operative to output said single output bit.

3. A bitstream generator according to claim 2 and wherein said combinatorial selection logic device comprises a multiplexer (MUX).

4. A bitstream generator according to claim 1 and also comprising:
    a second combiner operative to combine output bits from all of the at least a second LFSR that are assigned as assignors to produce a series of decision bits which are applied as an entry to a policy table to determine assignments of each of at least some of the plurality of LFSRs for the second time period.

5. A bitstream generator according to claim 4 and wherein said second combiner comprises:
    at least one combinatorial selection logic device which is operative to combine said output bits from all of the at least a second LFSR that are assigned as assignors to produce a set of bits every clock cycle;
    an assignor LUT operatively associated with said at least one combinatorial selection logic device and operative to combine said set of bits to form a single intermediate bit every clock cycle; and
    a scrambling buffer, operatively associated with said assignor LUT and operative to perform scrambling operations on all intermediate bits generated during the first time period and to output a series of decision bits to said policy table.

6. A bitstream generator according to claim 5 and wherein said combinatorial selection logic device comprises a MUX.

7. A bitstream generator according to claim 1 and wherein said assignment as an assignor also includes an assignment as a combined assignor and lag generator.

8. A bitstream generator according to claim 7 and wherein said lag generator is operative to determine, during the first time period, a lag having a length of an integer number N of shifts for an LFSR for the second time period.

9. A bitstream generator according to claim 1 and also comprising at least a third LFSR operative, when assigned as a time-period assignor during said first time period, to provide an output bit for determining a start time and a length of the second time period.

10. A bitstream generator according to claim 9 and also comprising:
    a third combiner operative to combine output bits from all of the at least a third LFSR that are assigned as time-period assignors to produce a series of time decision bits; and
    a policy table operatively associated with the third combiner and operative to accept the series of time decision bits as an entry for determining the start time and the length of the second time period.

11. A bitstream generator according to claim 1 and also comprising a control logic unit operative to control the operation of at least one of the following: the first combiner; the second combiner; the third combiner; and the plurality of LFSRs.

12. A bitstream generator according to claim 1 and wherein said bit stream comprises a pseudo random binary sequence.

13. A bitstream generator according to claim 1 and wherein said single output bit outputted by the first combiner comprises a result of a hash function.

14. A bitstream generator according to claim 1 and wherein said plurality of LFSRs comprise LFSRs having different lengths.

15. A bitstream generator according to claim 14 and wherein said different lengths are limited to a selected range of lengths.

16. A bitstream generator according to claim 1 and wherein said first time period comprises only one clock cycle.

17. A bitstream generator according to claim 1 and wherein said second time period comprises only one clock cycle.

18. A bitstream generator according to claim 1 and wherein said first time period has a length longer than one clock cycle.

19. A bitstream generator according to claim 1 and wherein said second time period has a length longer than one clock cycle.

20. A bitstream generator according to claim 1 and wherein the second time period follows the first time period after a time delay.

21. A bitstream generator according to claim 20 and wherein the time delay comprises at least one clock cycle.

22. A bitstream generator according to claim 21 and wherein the time delay comprises a time period having a length of one of the following: the first time period; and the second time period.

23. A method for generating a bit stream comprising:

providing a plurality of linear feed shift registers (LFSRs);

assigning at least a first LFSR of the plurality of LFSRs during a first time period as a generator which is operative to provide an output bit in each clock cycle within said first time period;

assigning at least a second LFSR of the plurality of LFSRs during said first time period as an assignor which is operative, in each clock cycle to provide an output bit for determining assignments of at least some of the plurality of LFSRs for a second time period following said first time period, said assignments including: assignment as a generator; and assignment as an assignor; and combining output bits from all of the at least a first LFSR of the plurality of LFSRs being assigned as generators to produce during each clock cycle a single output bit which is provided to the bit stream.

* * * * *